United States Patent [19]

Appleby, Jr. et al.

[11] Patent Number: 4,810,972

[45] Date of Patent: Mar. 7, 1989

[54] AUTOMATIC SHORT CIRCUIT TESTER CONTROL DEVICE

[75] Inventors: Harold R. Appleby, Jr., Penn Township, Westmoreland County; Ignatius N. Bova, Pittsburgh, both of Pa.

[73] Assignee: Westinghouse Electric Corp., Pittsburgh, Pa.

[21] Appl. No.: 104,720

[22] Filed: Oct. 5, 1987

[51] Int. Cl.[4] .................. G01R 31/12; G01R 31/02
[52] U.S. Cl. .................. 324/541; 324/509; 324/551; 340/650
[58] Field of Search .................. 128/908, 736; 361/42; 340/649–652; 324/508, 509, 510, 538–544, 73 R, 73 PC, 65 R

[56] References Cited

U.S. PATENT DOCUMENTS

| | | | |
|---|---|---|---|
| 3,771,098 | 11/1973 | Dempsey | 324/508 |
| 3,836,844 | 9/1974 | Prugh | 324/508 |
| 3,922,600 | 11/1975 | Roveti | 324/508 |
| 4,160,947 | 7/1979 | Tanno | 324/539 |
| 4,200,104 | 4/1980 | Harris | 361/42 |
| 4,204,154 | 5/1980 | Rosier | 324/539 |
| 4,225,819 | 9/1980 | Grau | 324/73 PC |
| 4,670,707 | 6/1987 | Allard | 29/593 |
| 4,734,651 | 3/1988 | Keller | 324/538 |

FOREIGN PATENT DOCUMENTS 0055271 3/1985 Japan .................. 324/541

Primary Examiner—Reinhard J. Eisenzopf
Assistant Examiner—Jose M. Solis
Attorney, Agent, or Firm—D. C. Abeles

[57] ABSTRACT

A method and apparatus for testing the insulation between a conductor and ground by means of a device having two input terminals for measuring the resistance between the conductor and ground, by: connecting one terminal of the device to ground; testing the continuity of the connection established between the one terminal of the device and ground; connecting the other terminal of the device to the conductor; applying a voltage between the conductor and ground and measuring the impedance therebetween while the voltage is being applied; and after the step of testing, conductively connecting the conductor to ground for discharging any charge capacitively stored in the conductor.

18 Claims, 1 Drawing Sheet

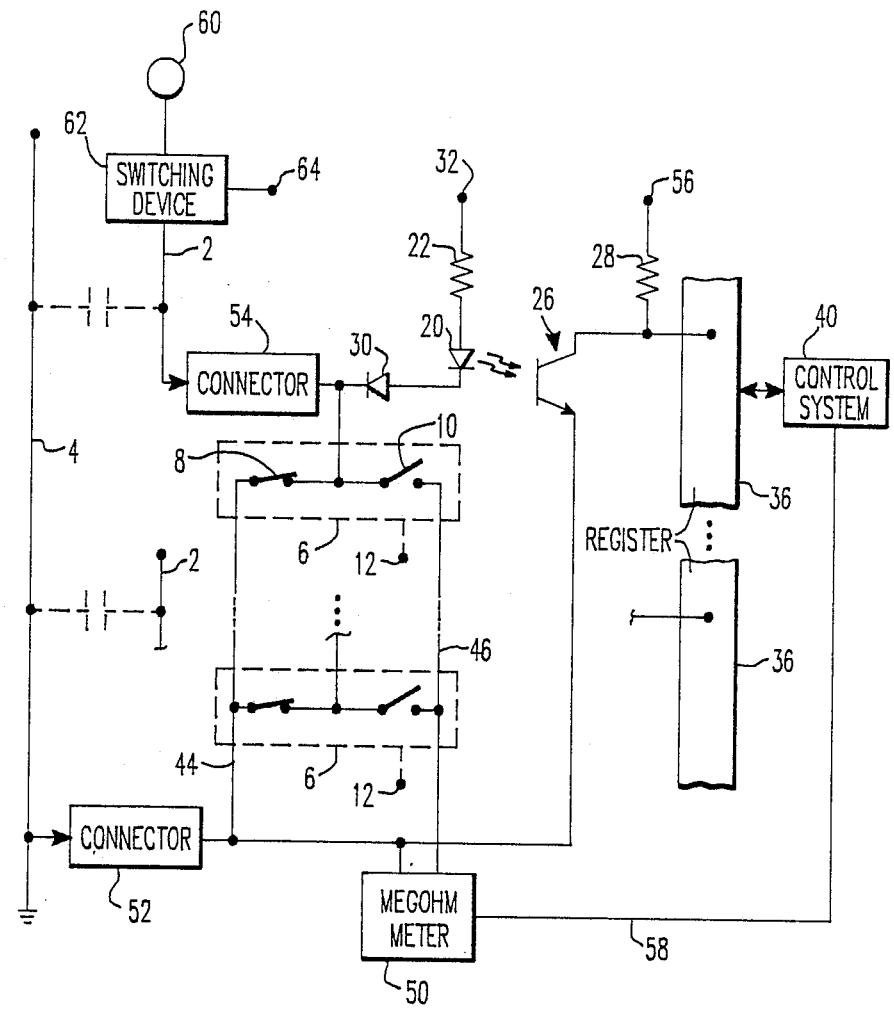

AUTOMATIC SHORT CIRCUIT TESTER CONTROL DEVICE

BACKGROUND OF THE INVENTION

The present invention relates to a method and apparatus for controlling the operation of a short circuit testing system, particularly a system for sequentially testing the insulation of a plurality of conductors to ground.

In the manufacture and maintenance of high voltage electrical equipment, such as generators and motors, it is necessary to test the insulation between individual conductors and ground. This can be done, for example, by measuring the resistance between each conductor and ground, utilizing a megohmeter while a high voltage is applied between the conductor and ground. In order for such test to be reliable, it is necessary to assure that the proper connection has been established between the meter and both the conductor and a point at ground potential.

In addition, when a high voltage is applied to an insulated conductor, which will normally have a capacitive coupling to ground, the resulting charge accumulation will cause a voltage to remain between the conductor and ground for at least a certain period of time after the high voltage source has been disconnected. This remaining voltage can represent a shock hazard to operating personnel and could cause damage to the apparatus being tested.

In addition, each conductor being tested is normally connected to the meter via a relay, and it is desirable to confirm the proper functioning of the relay before application of the high voltage to the associated conductor.

SUMMARY OF THE INVENTION

It is an object of the present invention to assure dissipation of the voltage present on such a conductor after such a test has been completed and the high voltage source has been diconnected.

Another object of the invention is to assure proper connection of the test system to ground before high voltage is applied to a conductor.

Another object of the invention is to confirm proper functioning of each high voltage relay of the test system before the high voltage is applied to a conductor.

Yet another object of the invention is to assure proper connection between a conductor which is to be tested and the test system.

The above and other objects are achieved, according to the present invention, by a novel method and apparatus for use in testing the insulation between a conductor and ground by means of a device having two input terminals for measuring the resistance between the conductor and ground. According to the invention, one terminal of the device is connected to ground, the continuity of the connection established between the one terminal of the device and ground is tested, the other terminal of the device is connected to the conductor, a voltage is applied between the conductor and ground and the resistance therebetween is measured while the voltage is being applied, and, after the step of testing, the conductor is conductively connected to ground for discharging any charge capacitively stored in the conductor.

The objects of the invention are further achieved by the provision of apparatus for testing the insulation between a conductor and ground by means of a device having two input terminals for measuring the resistance between the conductor and ground, which apparatus includes at least one control unit composed of: means for connecting one terminal of the device to ground; means connected for testing the continuity of the connection established between the device and ground; means for connecting the other terminal of the device to the conductor; and means for applying a voltage between the conductor and ground and for permitting measurement of the impedance therebetween by the device while the voltage is being applied; wherein the means connected for testing the continuity are operative, after a voltage has been applied, for connecting the conductor to ground for discharging any charge capacitively stored in the conductor.

BRIEF DESCRIPTION OF THE DRAWING

The sole FIG. is a schematic diagram of a test apparatus incorporating a preferred embodiment of the invention.

DESCRIPTION OF THE PREFERRED EMBODIMENTS

The FIG. shows an embodiment of an automatic short circuit tester control device according to the invention for monitoring and controlling the sequential short circuit testing of a plurality of conductors 2 which, in the absence of insulation faults, have a high resistance to ground. By way of nonlimiting example, each conductor 2 may be a half coil strand for a large generator. The Figure illustrates two of a large number of conductors 2 and it should be understood that any number of conductors can be tested in sequence.

All conductors 2 are normally conductively isolated from ground 4 but are capacitively coupled thereto, by distributed capacitances, the capacitive coupling being represented by broken-line capacitors.

The device itself is composed of a plurality of units, each associated with a respective conductor 2 to be tested. Each unit includes an individually operated relay 6 having a normally closed contact 8, a normally open contact 10, an operating coil (not shown) and a control input 12 for supplying energizing current to the coil. When current is supplied to input 12, contact 8 opens and contact 10 closes.

Each unit further includes a voltage monitoring part composed of a current-to-light transducer, preferably composed of an LED 20 and a current limiting resistor 22, and a light-to-electric signal transducer, which may be composed of a phototransistor 26 and a current limiting resistor 28.

The current-to-light transducer is connected to contacts 8 and 10 via a blocking diode 30, and resistor 22 is supplied with a selected bias potential at terminal 32. The value of this potential is selected so that LED 20 produces maximum light output when the side of diode 30 remote from LED 20 is satisfactorily grounded.

The collector of phototransistor 26 is connected to a respective stage of an input register 36 associated with a control system 40, which may be a programmable controller. Control system 40 is connected to supply operating current to the input 12 of each unit.

Contacts 8 and 10 are connected to a common connection point which is connected to the side of diode 30 which is remote from LED 20. The side of contact 8 remote from the common connection point is connected by a conductor 44 to the corresponding point of every other unit. The side of switch 10 remote from the common connection point is connected by a conductor 46 to the corresponding point of every other unit.

Conductors 44 and 46 are connected to the resistance test terminals of a megohmeter 50, and conductor 44 is additionally connected to a connector 52 removably connected to conductor 4. The common connection point between the switches 8 and 10 of each unit is connected to a respective connector 54 removably connected to a respective one of conductors 2.

Each of connectors 52 and 54 can be any suitable type of readily removable connector. The complete control device includes a plurality of connectors 54, each associated with a respective unit for connection to a respective conductor 2, and a single connector 52 common to all units.

The emitter of phototransistor 26 is connected to conductor 44, and operating potential for phototransistor 26 is applied to a terminal 56 at one end of resistor 28.

To perform a short-circuit test, connector 52 is connected to conductor 4 and each connector 54 is connected to a respective conductor 2. Selected potentials are applied to terminals 32 and 56 and relays 6 are all de-energized so that contacts 8 are closed. Thus, a current flow path is established from terminal 32 to ground via parts 22, 20, 30, 8, 44 and 52. If this path has the appropriate continuity to ground, the light output from LED 20 has an intensity which places phototransistor 26 in its conductive state so that the potential at the associated stage of register 36 is close to ground. In this case, controller 40 receives a signal indicative that the connection of the control device to ground via connector 52 is good. Otherwise, the potential at the associated stage of register 36 would be higher, producing a warning of a faulty ground connection.

Then, relay 6 of the selected unit is energized, via input 12, to open contact 8 and close contact 10. The light output from LED 20 drops to a low value, or zero, so that the impedance of phototransistor 26 increases and the potential at the associated stage of register 36 rises. This is sensed by controller 40 as an indication of proper relay functioning.

Upon appearance of these indications of proper ground connection and relay function, i.e. a low signal at the associated register stage followed by a high signal, controller 40 causes a high voltage to be applied between the selected conductor 2 and ground and the response of megohmeter 50 is monitored. LED 20 and phototransistor 26 are isolated from this high voltage by diode 30, which has a reverse voltage selected in accordance with the potential level to be applied to conductor 2. In addition, the electrical isolation between LED 20 and phototransistor 26 provides further high voltage protection for register 36.

Megohmeter 50 possesses a selected resistance between its resistance test terminals. Therefore, when a high voltage having a given amplitude is applied between the selected conductor 2 and conductor 4, and there is no short circuit between those conductors, the current through megohmeter 50 will reach a given minimum value. The current through megohmeter 50 is indicated by a signal at a megohmeter terminal which is connected by a conductor 58 to controller 40. If the current through megohmeter 50 does not attain a given minimum value during application of the high voltage, and megohmeter 50 does not indicate a short circuit between conductors 2 and 4, the most likely reason is a faulty connection between conductor 2 and connector 54. Therefore, when the signal on conductor 58 indicates this condition, controller 40 produces a faulty connection indication, on the basis of which all testing can be halted until the faulty connection has been corrected.

After the insulation of the selected conductor 2 has been measured by megohmeter 50, the high voltage is removed from the selected conductor 2 and the associated relay is de-energized, under control of controller 40, so that the selected conductor 2 is connected to ground to permit dissipation of any charge stored by the capacitance between that conductor 2 and ground. The establishment of this connection to ground is again indicated by the potential established by phototransistor at the associated stage of register 36. If this potential has the appropriate value, control is switched to the next conductor 2 and the above-described procedure is repeated. Otherwise, all testing is terminated and an alarm is emitted.

The high voltage for conductor testing can be applied to each conductor 2 from a high voltage source 60 via a controllable switching device 62 having a control terminal 64 connected to receive a control signal from control system 40.

One available megohmeter which can be employed is a programmable megohmeter model 727/205 offered by the Slaughter Company. This model is equipped with an RS 232 port providing an output indicative of the current flowing between its resistance test terminals. Controller 36, 40 could be a Numalogic brand PC Model 900 offered by Westinghouse Electric Corporation.

It will be understood that the above description of the present invention is susceptible to various modifications, changes, and adapatations, and the same are intended to be comprehended within the meaning and range of equivalents of the appended claims.

What is claimed is:

1. A method of testing the insulation between a conductor and ground by means of a device having two input terminals for measuring the resistance of the insulation between the conductor and ground, comprising:
    connecting one terminal of the device to ground;
    testing the continuity of the connection established between the one terminal of the device and ground;
    connecting the other terminal of the device to the conductor;
    applying a voltage between the conductor and ground and measuring the resistance of the insulation between the conductor and ground by means of the device while the voltage is being applied; and
    after said step of testing, conductively connecting the conductor to ground for discharging any charge capacity stored in the conductor.

2. A method as defined in claim 1 wherein said step of testing the continuity of the connection comprises: connecting a test impedance to the one terminal; applying a test voltage between the test impedance and ground; and monitoring the amplitude of the current flowing to ground through the test impedance.

3. A method as defined in claim 2 wherein the test impedance includes a current-to-light transducer, and said step of monitoring comprises detecting the intensity of the light produced by the transducer.

4. A method as defined in claim 3 wherein said step of detecting is performed by means of a phototransistor connected to the one terminal.

5. A method as defined in claim 3 further comprising isolating the transducer from the voltage applied between the conductor and ground.

6. A method as defined in claim 1 further comprising testing the continuity of the connection established between the other terminal of the device and the conductor.

7. A method as defined in claim 6 wherein said step of testing the continuity of the connection established between the other terminal of the device and the conductor is performed by monitoring the current, through the device during said step of applying a voltage.

8. A method as defined in claim 6 comprising halting operation of said method when continuity does not exist between the other terminal of the device and the conductor.

9. A method as defined in claim 1 comprising halting operation of said method upon appearance of an indication of a short circuit between the conductor and ground.

10. A method as defined in claim 1 comprising halting operation of said method when said step of testing the continuity indicates that continuity does not exist.

11. A method as defined in claim 1 comprising: monitoring the voltage between the conductor and ground during said step of conductively connecting and halting operation of said method when said monitoring step indicates that a charge remains stored in the conductor.

12. A method as defined in claim 1 for testing the insulation between a plurality of conductors and ground, comprising repeating said steps of testing, connecting, applying and measuring, and conductively connecting for each conductor.

13. Apparatus for testing the insulation between a conductor and ground by means of a device having two input terminals for measuring the resistance of the insulation between the conductor and ground, said apparatus including at least one control unit comprising:

means for connecting one terminal of the device to ground;

means connected for testing the continuity of the connection established between the device and ground;

means for connecting the other terminal of the device to the conductor; and means for applying a voltage between the conductor and ground and for permitting measurement of the impedance of the insulation between the conductor and ground by the device while the voltage is being applied;

wherein said means connected for testing the continuity are operative, after a voltage has been applied, for connecting the conductor to ground for discharging any charge capacitively stored in the conductor.

14. Apparatus as defined in claim 13 wherein each of said means for connecting comprises a respective removable connector.

15. Apparatus as defined in claim 13 wherein said means for testing the continuity of the connection established between the device and ground comprises: means defining a current flow path; a voltage source connected to one end of said current flow path; switching means connected to the other end of said current flow path and switchable into a first switching state for conductively connecting the other end of said flow path to the one terminal of the device; and current sensing means for sensing the current flowing through said flow path to ground.

16. Apparatus as defined in claim 15 wherein said current sensing means comprise a current-to-light transducer connected to form a part of said current flow path; and a light-to-electrical signal transducer optically coupled to said current-to-light transducer.

17. Apparatus as defined in claim 15 further comprising a relay having a normally closed contact constituting said switching means and a normally open contact forming part of said means for connecting the other terminal of the device to the conductor.

18. Apparatus as defined in claim 13 for testing the insulation between a plurality of conductors and ground, said apparatus comprising a plurality of said units, each associated with a respective conductor.

* * * * *